(12) United States Patent
Sato

(10) Patent No.: US 6,510,035 B2
(45) Date of Patent: Jan. 21, 2003

(54) COIL DRIVING METHOD, COIL DRIVING APPARATUS AND MRI APPARATUS

(75) Inventor: Kenji Sato, Tokyo (JP)

(73) Assignee: GE Medical Global Technology Company, LLC, Waukesha, WI (US)

(*) Notice: Subject to any disclaimer, the term of this patent is extended or adjusted under 35 U.S.C. 154(b) by 0 days.

(21) Appl. No.: 09/898,235

(22) Filed: Jul. 3, 2001

(65) Prior Publication Data
US 2002/0033697 A1 Mar. 21, 2002

(30) Foreign Application Priority Data
Sep. 19, 2000 (JP) ........................................ 2000-283467

(51) Int. Cl.[7] .............................................. H01H 47/00
(52) U.S. Cl. ......................................................... 361/146
(58) Field of Search ................................. 361/143, 144, 361/146, 152, 159

(56) References Cited

U.S. PATENT DOCUMENTS 6,404,340 B1 * 6/2000 Paradiso et al. .......... 340/572.5
6,326,789 B1 * 12/2001 Yoshida et al. ............. 324/318

\* cited by examiner

Primary Examiner—Matthew Nguyen
(74) Attorney, Agent, or Firm—Moonray Kojima

(57) ABSTRACT

With the objective of preventing variations in sensitivity even if samples to be inserted between an upper coil and a lower coil opposite to each other are different in body frame, a pre-scan is effected on a sample in a state in which the sample is placed in a space defined between the upper coil and the lower coil, and reflected waves sent from the coils are detected by a directional coupler. Further, a comparison controller controls an attenuator so that the voltages of the reflected waves are equalized. Afterwards, a main scan is carried out.

19 Claims, 6 Drawing Sheets

US 6,510,035 B2

COIL DRIVING METHOD, COIL DRIVING APPARATUS AND MRI APPARATUS

BACKGROUND OF THE INVENTION

The present invention relates to a coil driving method, a coil driving apparatus and an MRI (Magnetic Resonance Imaging) apparatus, and more specifically to a coil driving method, a coil driving apparatus and an MRI apparatus capable of preventing variations in sensitivity even if samples inserted between a coil on one side and a coil on the other side, both of which are opposed to each other, are different in body frame.

FIG. 5 is an explanatory view showing examples of a transmitting coil driving circuit and a transmitting coil employed in an MRI apparatus which is related to the present invention.

The transmitting coil driving circuit 9-J is provided with an amplifier 21 for power-amplifying a drive pulse Dp, and a splitter 22 for splitting the output of the amplifier 21 In four for four coils that constitute a transmitting coil 5.

The transmitting coil 5 comprises an upper coil 5A and a lower coil 5B opposite to each other in a vertical direction.

The upper coil 5A comprises an upper first coil 51A ant an upper second coil 52A.

The lower coil 5B comprises lower first coil 51B and a lower second coil 52B.

When power is supplied to the upper first coil 51A, current flows in the form of a figure of 8, so that a magnetic field H1 which extends in the direction orthogonal to a current I1A that travels across the center of the coil and which is parallel with the surface of the coil, is formed in a space away slightly downward from the center of the coil surface.

When power is supplied to the upper second coil 52A, a current flows in the form of a figure of 8, so that a magnetic field H2 which extends in the direction orthogonal to a current I2A that travels across the center of the coil and which is parallel with the surface of the coil, is formed in a space away slightly downward from the center of the coil surface.

The upper first coil 51A and the upper second coil 52A are identical to each other in structure but different 90° from each other in the directions of the currents I1A and I2A. Thus, the magnetic fields H1 and H2 intersect at right angles.

While the lower first coil 51B is identical in structure to the upper first coil 51A, the direction of a current I1B, which travels across the center of the coil, is opposite to and parallel with that of the current I1A. Thus, when power is supplied to the lower fist coil 51B, a magnetic field for intensifying the magnetic field H1 is formed.

While the lower second coil 523 is identical En structure to the upper second coil 52A, the direction of a current I2B, which travels across the center of the coil, is opposite to and parallel with that of the current I2A. Thus, when power is supplied to the lower second coil 52B, a magnetic field for intensifying the magnetic field H2 is formed.

In the transmitting coil driving circuit 9-J, power has uniformly been supplied to all the coils 51A, 52A, 51B and 52B from the splitter 22 Such a power supplying method shows no problem because electromagnetic coupling between the upper coil 5A and a sample and electromagnetic coupling between the lower coil 5B and the sample become equivalent to each other in a state in which the sample is inserted into a space defined between the upper coil 5A and the lower coil 5B as shown in FIG. 6.

However, when a sample small in body frame is used as shown in FIG. 7, the sample is brought into a state of being located near the lower coil 5B rather than the upper coil 5A and hence electromagnetic coupling between the upper coil 5A and t he sample and electromagnetic coupling between the lower coil 5B and the sample are brought into unbalance. Therefore, the uniform supply of the power from the splitter 22 to all the coils 51A, 52A, 51B and 52B yields the unbalance between a magnetic field formed by the upper coil 5A and a magnetic field formed by the lower coil 5B, thus causing a problem that variations in sensitivity occur.

SUMMARY OF THE INVENTION

Therefore, an object of the present invention is to provide a coil driving method, a coil driving apparatus and an MRI apparatus capable of preventing variations in sensitivity even if samples inserted between a coil on one side and a coil on the other side both of which are opposed to each other, are different in body frame.

In a first aspect, the present invention provides a coil driving method comprising steps of inserting a sample between a coil on one side and a coil or the other side both of which are disposed so as to be opposite to each other, adjusting a balance in the supply of power to the both coils and thereafter supplying power to the both coils.

In the coil driving method according to the first aspect, the balance in the supply of the power to both coils is adjusted after the sample is actually inserted into a space defined between the coil on one side and the coil on the other side. Therefore, a magnetic filed formed by the coil on one side and a magnetic field formed by the coil on the other side always become equal to each other regardless of a body frame and a position of the sample, thus causing no variations in sensitivity.

In a second aspect, the present invention provides a coil driving method having the above configuration, which includes steps of measuring reflected waves sent from the both coils and controlling a power-supply balance so that the voltages of the reflected waves coincide with each other.

The coil driving method according o the second aspect has an advantage in that since the power-supply balance is adjusted with the voltages of the reflected waves from the coil on one side and the coil on the other side as indexes, the coil on one side and the coil on the other side need no work.

In a third aspect, the present invention provides a coil driving method having the above configuration, wherein magnetic field detecting means are provided in the vicinity of the coils and further including a step of controlling a power-supply balance so that the magnitudes of signals detected by the magnetic field detecting means coincide with each other.

The coil driving method according to the third aspect has an advantage in that since magnetic fields generated by the coil on one side and the coil on the other side are actually measured to adjust the power-supply balance, the power-supply balance can directly be adjusted as compared with the case where the voltages of the reflected waves are set as the indexes.

In a fourth aspect, the present invention provides a coil driving method comprising steps of controlling a balance in the supply of power to a coil on one side and a coil on the other side, both of which are disposed so as to be opposite to each other, the balance being determined in advance in association with a body frame of a sample inserted between the two coils, and thereafter supplying power to the both coils.

A shift in the balance of the supply of power to each of the coil on one side and the coil on the other side depends on the body frame of the sample. In other words, the amount of compensation for the shift in the power-supply balance can be recognized from the body frame of the sample.

In the coil driving method according to the fourth aspect, the power-supply balance is adjusted according to the amount of compensation determined in advance in association with the body frame of the sample. Therefore, a magnetic filed formed by the coil on one side and a magnetic field formed by the coil on the other side can evenly be adjusted, thus causing no variations in sensitivity. Since it is also unnecessary to actually insert the sample into a space defined between the coil on one side and the coil on the other coil and measure the power-supply balance, an advantage is brought about in that a work load is lightened.

In a fifth aspect, the present invention provides a coil driving method having the above configuration, including a step of using the weight of the sample as the body frame of the sample.

While the weight of the sample and its body thickness may be used as the body frame of the sample which causes a shift in the balance in the supply of power to the coil on one side and the coil on the other side, the weight is apt to be best handled.

Since the weight is used as the body frame of the sample in the coil driving method according to the fifth aspect, its handling becomes the simplest.

In a sixth aspect, the present invention provides a coil driving method having the above configuration, wherein the coil on one side comprises a first coil on one side and a second coil on one side, magnetic fields formed by the first coil on one side and the second coil on one side intersect at right angles in a coil-to-coil space defined between the coil on one side and the coil on the other side, the coil on the other side comprises a first coil on the other side and a second coil on the other side, a magnetic field formed by the first coil on the other side is parallel with a magnetic field formed by the first coil on one side within the coil-to-coil space, and a magnetic field formed by the second coil on the other side is parallel with a magnetic field formed by the second coil on one side within the coil-to-coil space.

In the coil driving method according to the sixth aspect, the present invention can be applied to a transmitting coil employed in an MRI apparatus.

In a seventh aspect, the present invention provides a coil driving method having the above configuration, wherein the coil on one side and the coil on the other side are opposed to each other in a vertical or horizontal direction.

In the coil driving method according to the seventh aspect, the present invention can be applied to a transmitting coil employed in an MRI apparatus.

In an eighth aspect, the present invention provides a coil driving apparatus comprising power supplying means for supplying power to a coil on one side and a coil on the other side, both of which are placed so as to be opposed to each other, power-supply balance measuring means for measuring a balance in the supply of power to the both coils, and power-supply balance control means for adjusting the balance in the supply of power to the both coils.

The coil driving method according to the first aspect can suitably be executed in the coil driving apparatus according to the eighth aspect.

In a ninth aspect, the present invention provides a coil driving apparatus having the above configuration, wherein the power-supply balance measuring means includes reflected wave measuring means for measuring reflected waves sent from the coils.

The coil driving method according to the second aspect can suitably be carried out in the coil driving apparatus according to the ninth aspect.

In a tenth aspect, the present invention provides a coil driving apparatus having the above configuration, wherein the reflected wave measuring means is a directional coupler.

In the coil driving apparatus according to the tenth aspect, the coil driving method according to the second aspect can suitably be implemented using the directional coupler.

In an eleventh aspect, the present invention provides a coil driving apparatus having the above configuration, wherein the power-supply balance measuring means includes magnetic field detecting means provided in the vicinity of the coils.

In the coil driving apparatus according to the eleventh aspect, the coil driving method according to the third aspect can suitably be carried out.

In a twelfth aspect, the present invention provides a coil driving apparatus having the above configuration, wherein the magnetic field detecting means are pick-up coils.

In the coil driving apparatus according to the twelfth aspect, the coil driving method according to the third aspect can suitably be implemented using the pick-up coils.

In a thirteenth aspect, the present invention provides a coil driving apparatus comprising power supplying means for supplying power to a coil on one side and a coil on the other side, both of which are placed so as to be opposed to each other, and power-supply balance control means for adjusting a balance in the supply of power to the both coils, which is determined in advance in association with a body frame of a sample inserted between the both coils.

In the coil driving apparatus according to the thirteenth aspect, the coil driving method according to the fourth aspect can suitably be implemented.

In a fourteenth aspect, the present invention provides a coil driving apparatus wherein in the coil driving method configured as described above, the weight of the sample is used as the body frame of the sample.

In the coil driving apparatus according to the fourteenth aspect, the coil driving method according to the fifth aspect can suitably be implemented.

In a fifteenth aspect, the present invention provides a coil driving apparatus having the above configuration, wherein the coil on one side comprises a first coil on one side and a second coil on one side, magnetic fields formed by the first coil on one side and the second coil on one side intersect at right angles within a coil-to-coil space defined between the coil on one side and the coil on the other side, the coil on the other side comprises a first coil on the other side and a second coil on the other side, a magnetic field formed by the first coil on he other side is parallel with a magnetic field formed by the first coil on one side within the coil-to-coil space, and a magnetic field formed by he second coil on the other side is parallel with a magnetic field formed by the second coil on one side within the coil-to-coil space.

In the coil driving apparatus according to the fifteenth aspect, the coil driving method according to the sixth aspect can suitably be implemented.

In a sixteenth aspect, the present invention provides a coil driving apparatus having the above configuration, wherein the coil on one side and the coil on the other side are opposed to each other in a vertical or horizontal direction.

In the coil driving apparatus according to the sixteenth aspect, the coil driving method according to the seventh aspect can suitably be implemented.

In a seventeenth aspect, the present invention provides an MRI apparatus equipped with the coil driving apparatus configured as described above.

In the coil driving apparatus according to the seventeenth aspect, the coil driving method according to the seventh aspect can suitably be implemented.

According to a coil driving method, a coil driving apparatus and an MRI apparatus of the present Invention, even if samples inserted between a coil on one side and a coil on the other side, both of which are opposite to each other, are different in body frame, a magnetic field formed by the coil on one side and a magnetic field formed by the coil on the other side are always brought into uniformity, so that variations in sensitivity is prevented from occurring.

Further objects and advantages of the present invention will be apparent from the following description of the preferred embodiments of the invention as illustrated in the accompanying drawings.

DETAILED DESCRIPTION OF THE INVENTION

The present invention will hereinafter be described in further details by embodiments illustrated in the accompanying drawings.

First Embodiment

Figure 1:
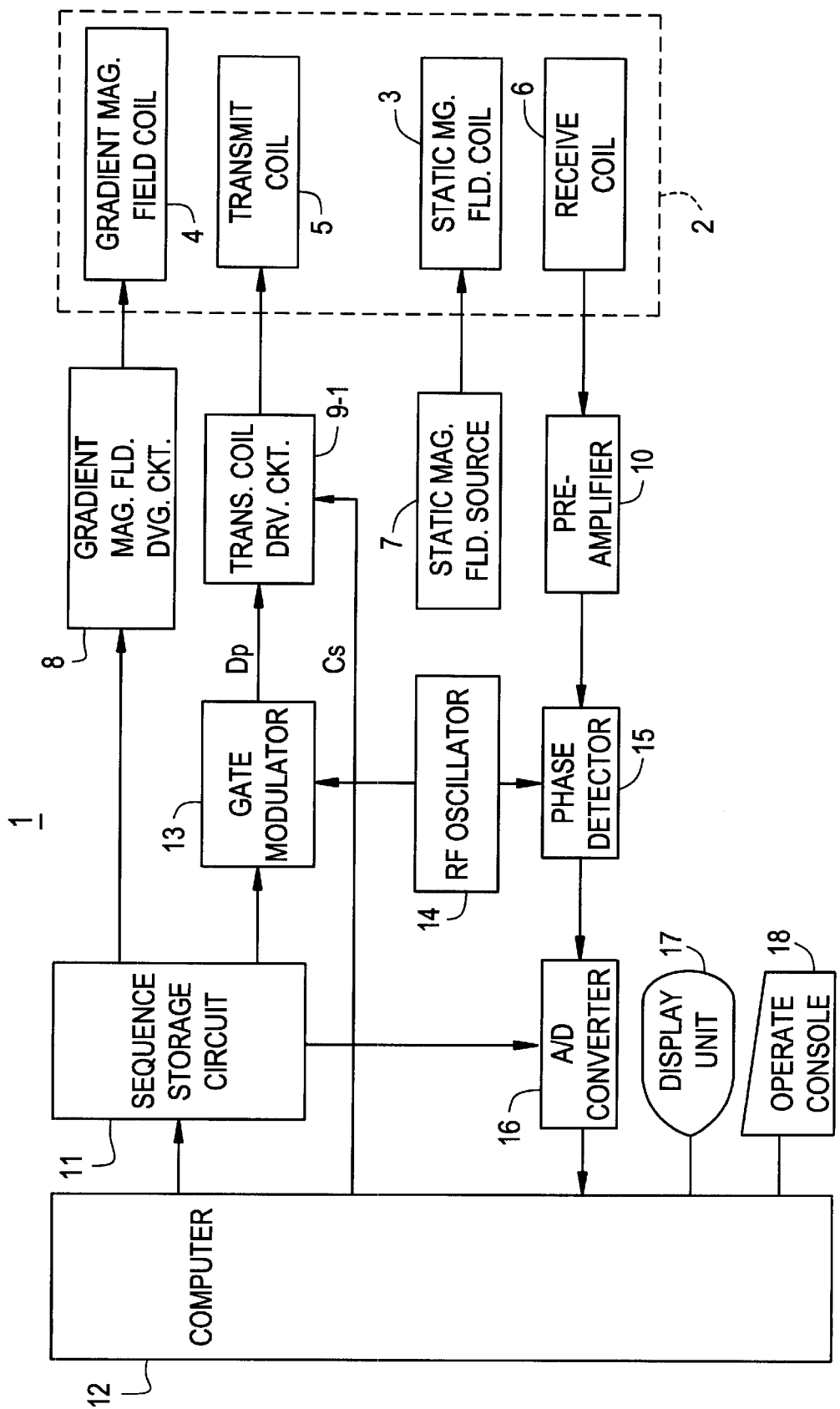
FIG. 1 is a block diagram showing an MRI apparatus according to a first embodiment of the present invention.

FIG. 1 is a configurational block diagram showing an MRI apparatus according to a first embodiment of the present invention.

In the present MRI apparatus 1, a magnet assembly 2 has a space (hole) for inserting a sample therein. A static magnetic field coil 3 for applying a constant static magnetic field to the sample, a gradient or slope magnetic field coil 4 for generating gradient or slope magnetic fields for a slice axis, a lead axis and a phase axis, a transmitting coil 5 for supplying an RF pulse for exciting the spin of a nucleus in the sample, and a receiving coil 6 for detecting an NMR signal from the sample are disposed in the magnet assembly 2 so as to surround the space.

The static magnetic field coil 3 is electrically connected to a static magnetic field source 7. The gradient magnetic field coil 4 is electrically connected to a gradient or slope magnetic field driving circuit or driver 8. The transmitting coil 5 is electrically connected to a transmitting coil driving circuit 9-1. The receiving coil 6 is electrically connected to a pre-amplifier 10. Incidentally, a permanent magnet may be used in place of the static magnetic field coil 3.

A sequence storage circuit 11 controls or operates the gradient magnetic field driving circuit 8, based on a pulse sequence stored therein in accordance with instructions given from a computer 12 to thereby generate a gradient magnetic field from the gradient magnetic field coil 4 of the magnet assembly 2. Further, the sequence storage circuit 11 operates a gate modulator 13 to modulate a carrier output signal produced from an RF oscillator 14 to a pulsated signal represented in the form of a predetermined timing and predetermined envelope and add it to the transmitting coil driving circuit 9-1 as a drive pulse Dp, where it is power-amplified. Thereafter, the transmitting coil driving circuit 9-1 applies the pulse to the transmitting coil 5 from which an RF pulse is transmitted to thereby excite a desired region.

The pre-amplifier 10 amplifies an NMR signal from the sample, which is detected by the receiving coil 6, and inputs the amplified NMR signal to a phase detector 15. The phase detector 15 receives a carrier output signal produced from the RF oscillator 14 as a reference signal, phase-detects the NMR signal supplied from the pre-amplifier 10 and supplies it to an A/D converter 16. The A/D converter 16 converts the phase-detected analog signal to a digital signal and inputs it to the commuter 12.

The computer 12 reads data from the A/D converter 16 and performs an image reconstructing computation on the data to thereby generate an image for a desired slice region. The image is displayed on a display unit 17. Further, the computer 12 takes charge of the entire control such as the reception of information inputted through an operation console 18.

Incidentally, the MRI apparatus 1 may be an open type MRI apparatus used in interventional MRI.

Figure 2:
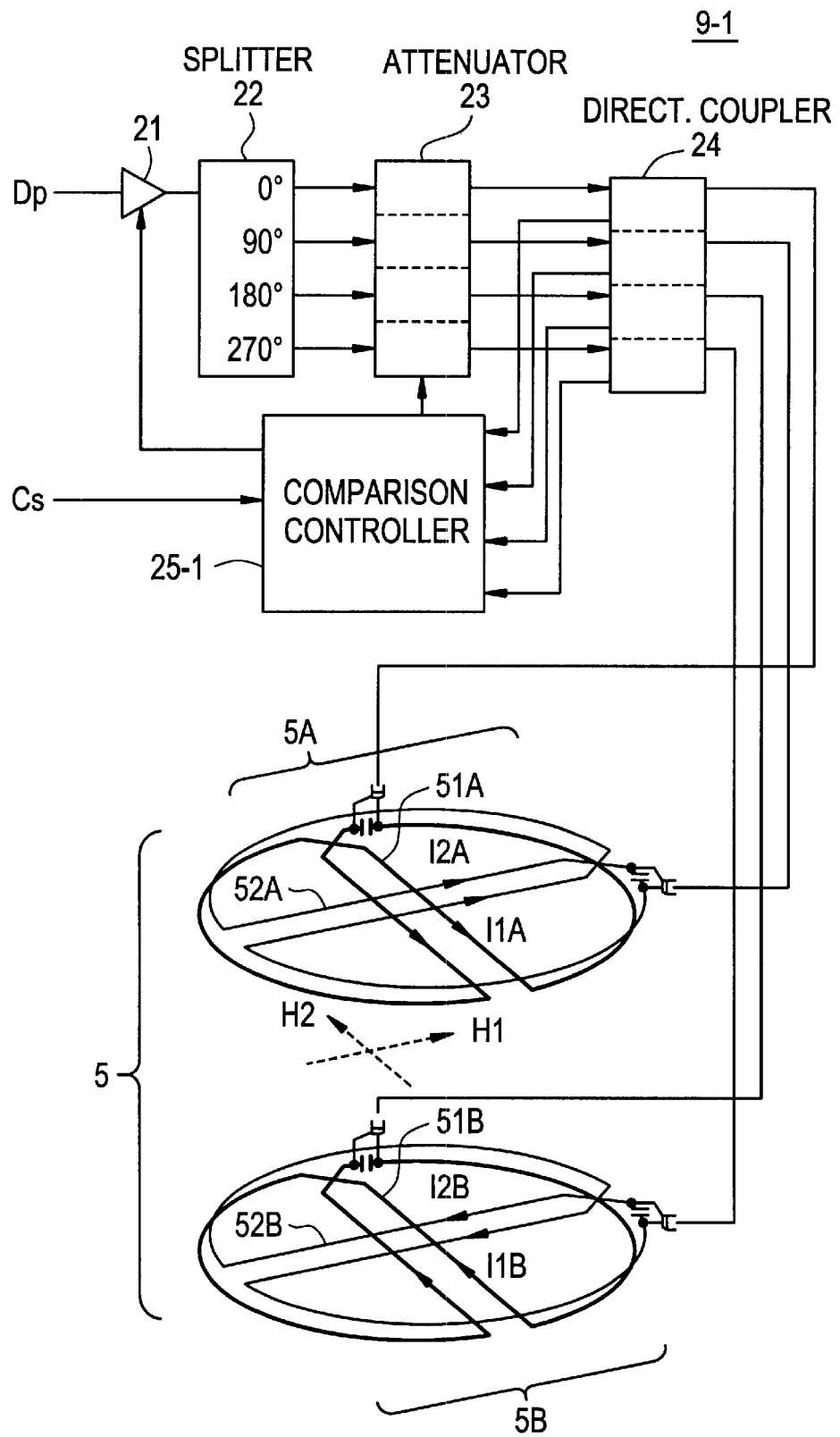
FIG. 2 is a diagram for describing a coil driving circuit and a transmitting coil according to the first embodiment of the present invention.

FIG. 2 is an explanatory view showing the transmitting coil driving circuit 9-1 and the transmitting coil 5.

The present transmitting coil driving circuit 9-1 has an amplifier 21 for power-amplifying a drive pulse Dp, a splitter 22 for splitting the output of the pre-amplifier 21 in four for four coils that constitute the transmitting coil 5, an attenuator 23 having independent attenuators or attenuation devices with respect to the four outputs of the splitter 22, a directional coupler 24 for transmitting the outputs of the attenuator 23 to their corresponding four coils constituting the transmitting coil 5 and taking out reflected waves from these coils, and a comparison controller 25-1 for sampling and comparing the voltages of the reflected waves sent from the four coils constituting the transmitting coil 5 with timing corresponding to a control signal Cs sent from the computer 2, adjusting attenuation rates of the attenuator 23 so that the voltages are equally set, and controlling the output of the amplifier 21 according to each of the attenuation rates.

Incidentally, a variable gain amplifier may be used in place of the attenuator 23.

The transmitting coil 5 comprises an upper coil 5A and lower coil 5B opposite to each other in a vertical direction.

The upper coil 5A comprises an upper first coil 5 and an upper second coil 52A.

The lower coil 5B comprises a lower first coil 51B and a lower second coil 52B.

When power is supplied to the upper first coil 51A, a current flows in the form of a figure of 8, so that a magnetic field H1 which extends in the direction orthogonal to a current I1A that travels across the center of the coil and which is parallel with the surface of the coil, is formed in a space away slightly downward from the center of the coil surfaces When power is supplied to the upper second coil 52A, a current flows in the form of a figure of 8, so that a magnetic field H2 which extends in the direction orthogonal to a current I2A that travels across the center of the coil and which is parallel with the surface of the coil, is formed in a space away slightly downward from the center of the coil surface.

The upper first coil 51A and the upper second coil 52A are identical to each other in structure but different 90° from each other in the directions of the currents I1A and I2A. Thus, the magnetic fields H1 and H2 intersect at right angles.

While the lower first coil 51B is identical in structure to the upper first coil 51A, the direction of a current I1B, which travels across the center of the coil, is opposite to and parallel with that of the current I1A. Thus, when power is supplied to the lower first coil 51B, a magnetic field for intensifying the magnetic field H1 is formed.

While the lower second coil 52B is identical in structure to the upper second coil 52A, the direction of a current I2B, which travels across the center of the coil, is opposite to and parallel with that of the current I2A. Thus, when power is supplied to the lower second coil 52B, a magnetic field for intensifying the magnetic field H2 is formed.

When it is desired to image the sample, the sample is pre-scanned in a state in which it is placed in a space defined between the upper coil 5A and the lower coil 5B. Further, the comparison controller 25-1 adjusts the attenuator 23 so that the voltages of the reflected waves are equally set. Afterwards, a main scan is effected on the sample. Thus, a magnetic field formed by the upper coil 5A and a magnetic field formed by the lower coil 5B are brought into uniformity regardless of the body frame and position of the sample, so that variations in sensitivity are prevented from occurring.

Second Embodiment

Figure 3:
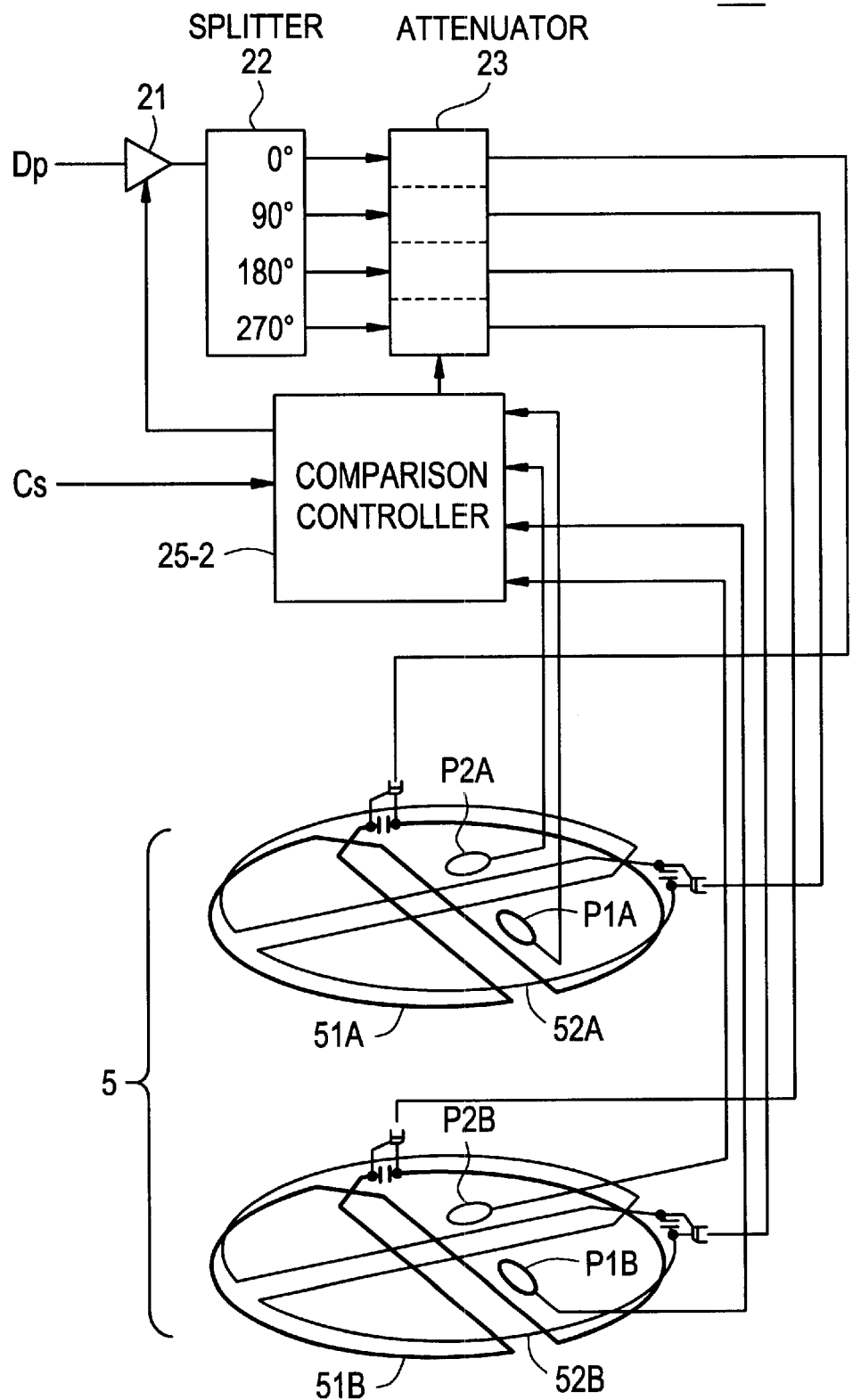
FIG. 3 is a diagram for describing a coil driving circuit and a transmitting coil according to a second embodiment of the present invention.

FIG. 3 is an explanatory view showing a transmitting coil driving circuit 9-2 and a transmitting coil 5 according to a second embodiment. Incidentally, the same elements of structure as those employed in the first embodiment are respectively identified by the same reference numerals and the description thereof will therefore be simplified.

The transmitting coil driving circuit 9-2 comprises an amplifier 21, a splitter 22, an attenuator 23, pick-up coils P1A, P2A, P1B and P2B respectively placed in the vicinity of four coils which constitute the transmitting cool 5, and a comparison controller 25-2 for sampling and comparing voltages induced by the respective pick-up coils P1A, P2A, P1B and P2B with timing corresponding to a control signal Cs sent from a computer 12, adjusting attenuation rates of the attenuator 23 so that the voltages are respectively brought to prescribed ratios, and controlling the output of the amplifier 21 according to each of the attenuation rates.

The transmitting coil 5 comprises an upper coil 5A and a lower coil 5B opposite to each other in vertical direction.

The upper coil 5A comprises an upper first coil 51A and an upper second coil 52A.

The lower coil 5B comprises a lower first coil 51B and a lower second coil 52B.

Upon installation of the MRI apparatus, power is uniformly supplied to the four coils constituting the transmitting coil 5 in a state in which no sample is inserted into a space defined between the upper coil 5A and the lower coil 5B to thereby measure the ratios between the induced voltages of the pick-up coils P1A, P2A and between the induced voltages of the pick-up coils P1B and P2B. Thereafter, the measured ratios are stored as the prescribed ratios.

When it is desired to image the sample, the sample is pre-scanned in a state in which it is placed in the space defined between the upper coil 5A and the lower coil 5B. Further, the comparison controller 25-2 adjusts the attenuator 23 so that the induced voltages of the respective pick-up coils P1A, P2A, P1B and P2B are respectively brought to the prescribed ratios. Afterwards, a main scan is effected on the sample. Thus, a magnetic field formed by the upper coil 5A and a magnetic field formed by the lower coil 5B are brought into uniformity regardless of the body frame and position of the sample, so that sensitivity is prevented from becoming non-uniform.

Third Embodiment

Figure 4:
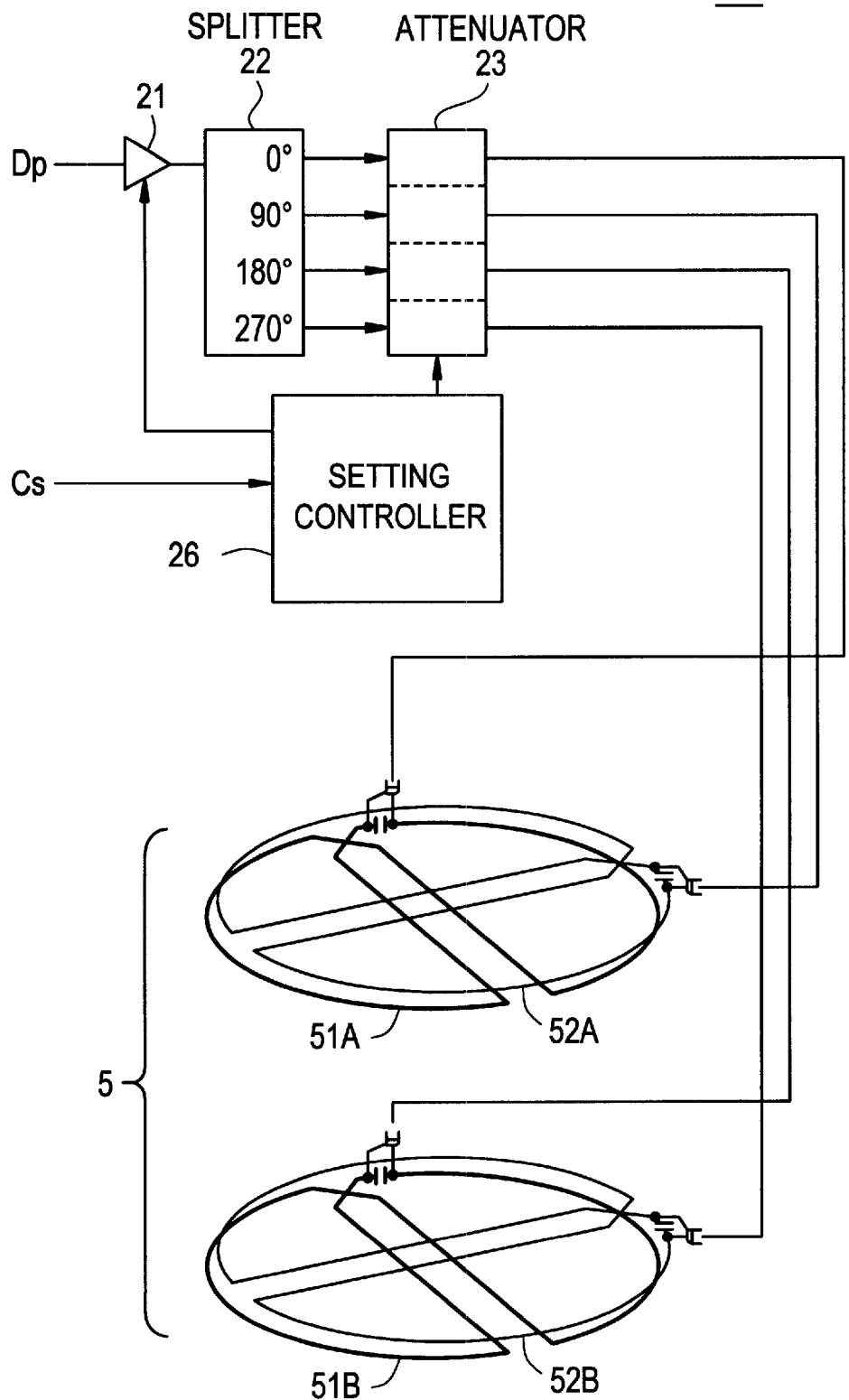
FIG. 4 is a diagram for describing a coil driving circuit and a transmitting coil according to a third embodiment of the present invention.
Figure 5:
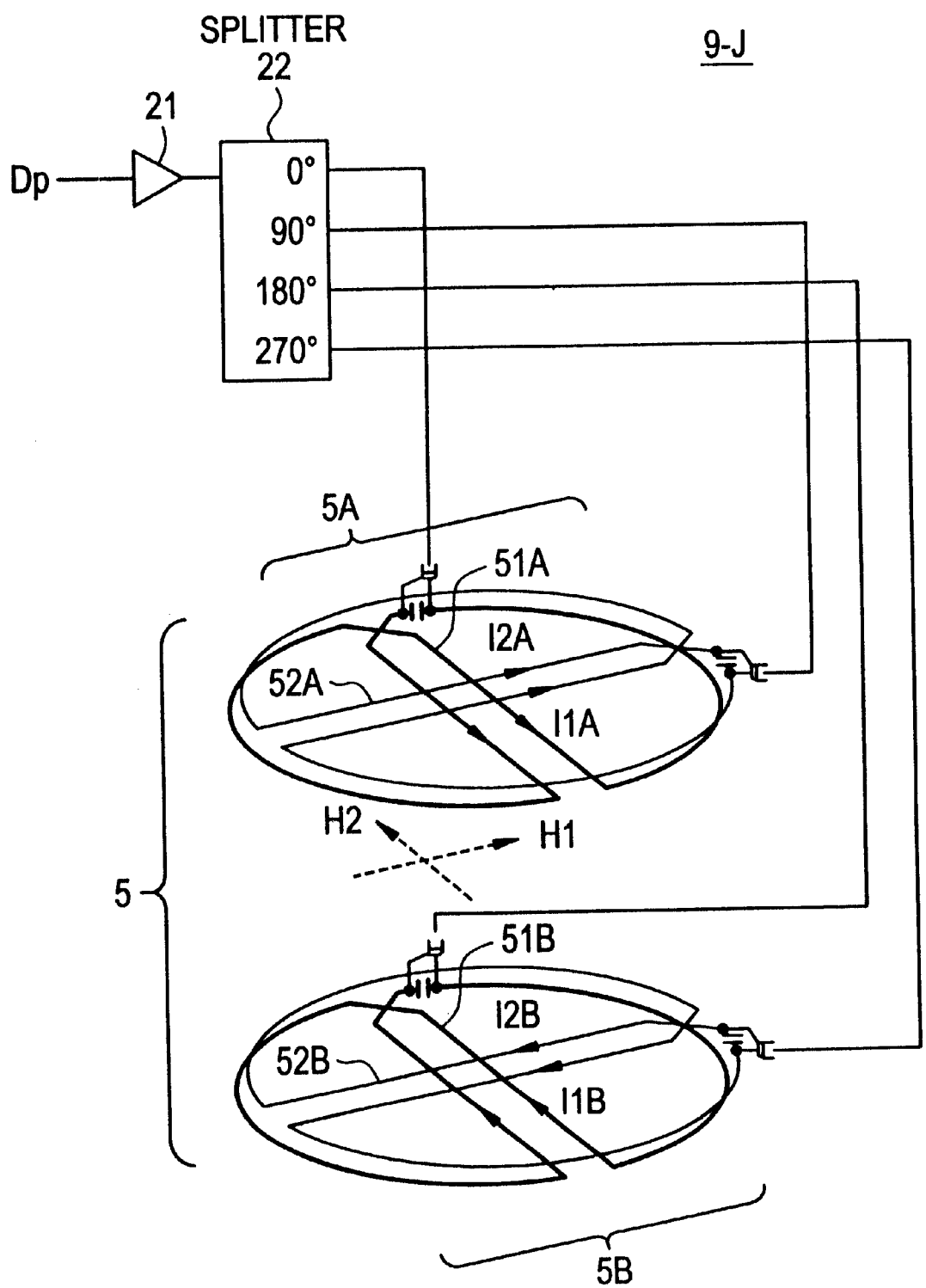
FIG. 5 is an explanatory view showing examples of a conventional coil driving circuit and transmitting coil.
Figure 6:
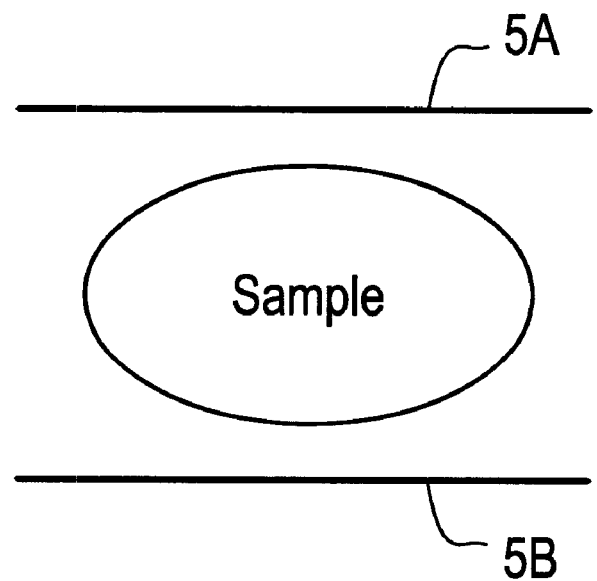
FIG. 6 is an explanatory view illustrating a state in which a sample is placed in the center of a space defined between a coil on one side and a coil on the other side.
Figure 7:
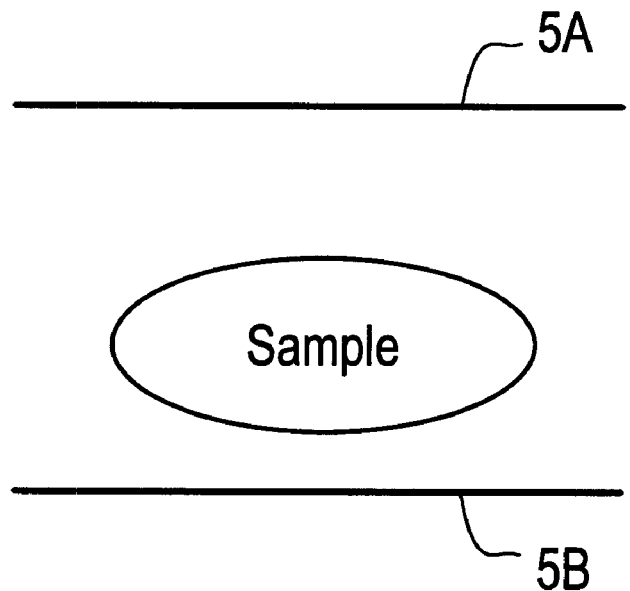
FIG. 7 is an explanatory view showing a state in which a sample is placed on the lower side as viewed from the center of a space defined between a coil on one side and a coil on the other side.

FIG. 4 is an explanatory view showing a transmitting coil driving circuit 9-3 and a transmitting coil 5 according to a third embodiment. Incidentally, the same elements of structure as those employed in the first embodiment are respectively identified by the same reference numerals and the description thereof will therefore be simplified.

The transmitting coil driving circuit 9-3 has an amplifier 21, a splitter 22 and a setting controller 26 for adjusting each of attenuation rates of an attenuator 23 so that each of the attenuation rates is brought to a value set by a control signal Cs sent from a computer 12, and controlling the output of the amplifier 21 according to the attenuation rate.

The transmitting coil 5 comprises an upper coil 5A and a lower coil 5B opposite to each other in a vertical direction.

The upper coil 5A comprises an upper first coil 51A and an upper second coil 52A.

The lower coil 5B comprises a lower first coil 51B and a lower second coil 52B.

Since the correlation between the weight (which may be a body thickness) of a sample and each of the attenuation rates of the attenuator 23 is found if the transmitting coil driving circuit 9-1 employed in the first embodiment and the transmitting coil driving circuit 9-2 employed in the second embodiment are used, the correlation therebetween is stored in the computer 12.

Upon imaging the sample, an operator inputs the weight of the sample through an operation control 18. In doing so, the computer 12 notifies the value of an attenuation rate corresponding o the weight of the sample to the setting controller 26 and causes the setting controller 26 to adjust the attenuator 23. Afterwards, a main scan is effected on the sample. Thus, a magnetic field formed by the upper coil 5A and a magnetic field formed by the lower coil 5B are brought into uniformity regardless of the body frame of the sample, so that sensitivity is prevented from becoming nonuniform.

Many widely different embodiments of the invention may be configured without departing from the spirit and the scope of the present invention. It should be understood that the present invention is not limited to the specific embodiments described in the specification, except as defined in the appended claims.

What is claimed is:

1. A coil driving method comprising the steps of:
    inserting a sample between a pair of coils disposed opposite each other;
    supplying power to said pair of coils;
    selectively controlling said supply of power to said pair of coils to achieve a balance;
    measuring reflected waves sent from said pair of coils; and
    controlling power supply balance so that voltage based on said reflected waves coincide with each other.

2. A coil driving method comprising the steps of:
    inserting a sample between a pair of coils disposed opposite each other;
    supplying power to said pair of coils; and
    selectively controlling said supply of power to said pair of coils to achieve a balance;
    wherein magnetic field detecting means are provided in vicinity of said pair of coils; and further comprising the step of controlling power supply balance so that magnitude of signals detected by said magnetic field detecting means coincide with each other.

3. A coil driving apparatus comprising:
    means for supplying power to a coil disposed on one side and a coil disposed on another side, both said coils being disposed opposite each other;
    means for measuring a balance in supply of power to both said coils; and
    means for controlling selectively said balance in supply of power to both said coils;
    wherein said means for measuring comprises means for measuring reflected waves sent from said both coils.

4. The apparatus of claim 3, wherein said means for measuring reflected waves comprises a directional coupler.

5. A coil driving apparatus comprising:
    means for supplying power to a coil disposed on one side and a coil disposed on another side, both said coils being disposed opposite each other;
    means for measuring a balance in supply of power to both said coils; and
    means for controlling selectively said balance in supply of power to both said coils;
    wherein said means for measuring comprises a magnetic field detecting device disposed in vicinity of both said coils.

6. The apparatus of claim 5, wherein staid magnetic field detecting device comprises a pick-up coil.

7. In an MRI apparatus comprising:
    a gradient magnetic field means;
    a static magnetic field means;
    a transmit/receive means; and
    means for providing images of a subject, the improvement comprising a coil driving apparatus comprising:
        means for supplying power to a coil disposed on one side and a coil disposed on another side, both said coils being disposed to be opposite each other;
        means for measuring a balance in supply of power to both said coils; and
        means for controlling selectively said balance in supply of power to both said coils;
        wherein said means for measuring comprises means for measuring reflected waves sent from both said coils.

8. A coil driving method comprising the steps of:
    inserting a sample between a pair of coils disposed opposite each other;
    supplying power to said pair of coils; and
    selectively controlling said supply of power to said pair of coils to achieve a balance therebetween so that magnetic fields produced by said pair of coils provide magnetic couplings respectively with said sample which are balanced and whereby sensitivity variations are prevented from occurring.

9. The method of claim 8, wherein said balance is determined in advance according to body frame of said sample.

10. The method of claim 9, wherein weight of said sample is used as said body frame.

11. The method of claim 8, wherein
    one of said pair of coils located on one side comprises:
        a first coil and a second coil disposed on said one said, wherein magnetic fields formed by said first coil and said second coil intersect at right angles in a coil-to-coil space defined between one of said pair of coils located on said one side and another of said pair of coils located on the other side; and wherein
    the other of said pair of coils located on the other side comprises:
        a third coil and a fourth coil disposed on said other side, wherein a magnetic field formed by said third coil disposed on said other side is parallel with a magnetic field formed by said first coil disposed on said one side within said coil-to-coil space, and wherein a magnetic field formed by said fourth coil disposed on said other side is parallel with a magnetic field formed by said second coil disposed on said one side within said coil-to-coil space.

12. The method of claim 8, wherein one of said pair of coils located on one side and the other of said pair of coils located on the other side are disposed opposite each other in a vertical direction or in a horizontal direction.

13. A coil driving apparatus comprising:
    means for supplying power to a coil disposed on one side and a coil disposed on another side with a sample disposed therebetween, both said coils being disposed opposite of each other;
    means for supplying power to both said coils; and
    means for selectively controlling said supply of power to both said coils to achieve a balance therebetween so that magnetic fields produced by said both coils provide magnetic couplings with respectively said sample which are balanced and whereby sensitivity variations are prevented from occurring.

14. The apparatus of claim 13, wherein weight of said sample is used to determine in advance said balance.

15. The apparatus of claim 13, wherein
    said first coil disposed on one side comprises:
        a third coil and a fourth coil disposed on said one side, wherein magnetic fields formed by said third coil and said fourth coil intersect at right angles in a coil-to-coil space defined between said first coil disposed on said one side and said second coil disposed on said other side; and wherein
    said second coil disposed on said other side comprises;
        fifth coil and sixth coil disposed on said other side, wherein a magnetic field formed by said fifth coil disposed on said other side is parallel with a magnetic field formed by said third coil disposed on said one side within said coil-to-coil space, and wherein a magnetic field formed by said sixth coil disposed on said other side is parallel with a magnetic field formed by said fourth coil disposed on said one side within said pair of coil-to-coil space.

16. The apparatus of claim 13, wherein said first and second coils are disposed opposite each other in a vertical direction or a horizontal direction.

17. An MRI apparatus comprising a gradient magnetic field means;

a static magnetic field means;

a transmit/receive means;

means for providing images of a subject; and a coil driving apparatus comprising:
    means for supplying power to a coil disposed on one side and a coil disposed on another side with a sample disposed therebetween, both said coils being disposed opposite each other;
    means for supplying power to both said coils; and
    means for selectively controlling said supply of power to both said coils to achieve a balance therebetween so that magnetic fields produced by said both coils provide magnetic couplings respectively with said sample which are balanced and whereby sensitivity variations are prevented from occurring.

18. The apparatus of claim 17, wherein said both coils are disposed opposite each other in a vertical direction or in a horizontal direction.

19. The apparatus of claim 17, wherein said balance is determined in advance according to body from of said sample disposed between said both coils.

* * * * *